United States Patent
Elmegreen et al.

(10) Patent No.: US 7,545,667 B2
(45) Date of Patent: Jun. 9, 2009

(54) PROGRAMMABLE VIA STRUCTURE FOR THREE DIMENSIONAL INTEGRATION TECHNOLOGY

(75) Inventors: Bruce G. Elmegreen, Golden Bridge, NY (US); Lia Krusin-Elbaum, Dobbs Ferry, NY (US); Chung Hon Lam, Peekskill, NY (US); Dennis M. Newns, Yorktown Heights, NY (US); Matthew R. Wordeman, Kula, HI (US); Albert M. Young, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 11/393,270

(22) Filed: Mar. 30, 2006

(65) Prior Publication Data

US 2007/0235708 A1    Oct. 11, 2007

(51) Int. Cl.
*G11C 11/00* (2006.01)

(52) U.S. Cl. ............................ 365/148; 365/163; 257/2; 257/3

(58) Field of Classification Search .................... 257/3, 257/2, 4, 5; 365/148, 163; 438/257, 585
See application file for complete search history.

(56) References Cited

U.S. PATENT DOCUMENTS

| | | | |
|---|---|---|---|
| 6,448,576 B1 | 9/2002 | Davis et al. | |
| 6,970,034 B1 | 11/2005 | Harris | 327/534 |
| 7,208,751 B2 | 4/2007 | Ooishi | |
| 7,221,579 B2 | 5/2007 | Krusin-Elbaum et al. | |
| 7,324,365 B2 | 1/2008 | Gruening-von Schwerin et al. | |
| 7,391,642 B2 * | 6/2008 | Gordon et al. | 365/163 |
| 2004/0051094 A1* | 3/2004 | Ooishi | 257/5 |
| 2005/0006681 A1* | 1/2005 | Okuno | 257/295 |
| 2005/0121789 A1 | 6/2005 | Madurawe | 257/758 |
| 2005/0158950 A1* | 7/2005 | Scheuerlein et al. | 438/257 |
| 2005/0188230 A1 | 8/2005 | Bilak | 713/300 |
| 2006/0278895 A1 | 12/2006 | Burr et al. | |
| 2006/0279978 A1 | 12/2006 | Krusin-Elbaum et al. | |
| 2007/0096071 A1 | 5/2007 | Kordus, II et al. | |
| 2007/0099405 A1* | 5/2007 | Oliva et al. | 438/585 |
| 2007/0295948 A1 | 12/2007 | Lam et al. | |
| 2008/0017842 A1 | 1/2008 | Happ et al. | |
| 2008/0048169 A1 | 2/2008 | Doyle et al. | |

OTHER PUBLICATIONS

U.S. Appl. No. 11/958,298, filed Dec. 17, 2007.
U.S. Appl. No. 11/672,110, filed Feb. 7, 2007.
U.S. Appl. No. 11/833,321, filed Aug. 2, 2007.
U.S. Appl. No. 11/833,354, filed Aug. 3, 2007.

(Continued)

*Primary Examiner*—Evan Pert
*Assistant Examiner*—Selim Ahmed
(74) *Attorney, Agent, or Firm*—Cantor Colburn LLP; Vazken Alexanian

(57) ABSTRACT

A programmable link structure for use in three dimensional integration (3DI) semiconductor devices includes a via filled at least in part with a phase change material (PCM) and a heating device proximate the PCM. The heating device is configured to switch the conductivity of a transformable portion of the PCM between a lower resistance crystalline state and a higher resistance amorphous state. Thereby, the via defines a programmable link between an input connection located at one end thereof and an output connection located at another end thereof.

3 Claims, 13 Drawing Sheets

OTHER PUBLICATIONS file://C:\DOCUME~1\ADMINI~1\LOCALS~\Temp\V9K43UPW. htm, Jul. 20, 2005, "What Are CPLDs and FPGAs", 1-3 pages.

S. Lai et al; "OUM—A 180 nm Nonvaltile Memory Cell Element Technology for Stand Alone and Embedded Applications;" IEEE, 2001, pp. 36.5.1-36.5.4.

J. Maimon et al; "Chalcogenide-Based Non-Volatile Memory Technology;" IEEE; 2001 pp. 5-2289-5-2294.

Young-Tae Kim et al.; "Study on Cell Characteristics of PRAM Using the Phase-Change Simulation;" IEEE 2003; pp. 211-214.

S. Tyson et al.; "Nonvolatile, High Density, High Performance Phase-Change Memory;" IEEE 2000; pp. 385-390.

C.J. Glassbrenner et al.; "Thermal Conductivity of Silicon and Germanium from 3° K to the Melting Point*," Physical Review vol. 134, No. 4A; May 18, 1964; pp. A1058-A1069.

"Exploring Potential Benefits of 3D FPGA Integration", 1-6 pages.

Jpn. J. Appl. Phys. vol. 40 (2001), Part 2, No. 6B, Jun. 15, 2001, "Temperature Dependence of TaSiN Thin Film Resistivity from Room Temperature to 900° C", Munenori Oizumi, Katsuhiro Aoki and Yukio Fukuda, pp. L603-L605.

Journal of Applied Physics, "Modeling of laser pulsed heating and quenching in optical data storage media", C. A. Volkert and M. Wuttig, vol. 86, No. 4, Aug. 15, 1999, pp. 1808-1816.

J. Appl. Phys. 82 (9), Nov. 1, 1997 "Experimental and theoretical investigations of laser-induced crystallization and amorphization in phase-change optical recording media", Chubing Peng, Lu Cheng, and M. Mansuripur, pp. 4183-4191.

Physical Review Letters, vol. 64, No. 11, Mar. 12, 1990, "Asymmetric Crystallization and Melting Kinetics in Sodium: A Molecular-Dynamics Study", C.J. Tymczak and John R. Ray, pp. 1278-1281.

Jpn. J. Appl. Phys. vol. 42 (2003), Part. 1, No. 2B, Feb. 2003, "Determination of the Crystallisation Kinetics of Fast-Growth Phase-Change Materials for Mark-Formation Prediction", Erwin R. Meinders and Martijn H. R. Lankhorst, pp. 809-812.

Science, vol. 267, Mar. 31, 1995, "Formation of Glasses from Liquids and Biopolymers", C. A. Angell, pp. 1924-1934.

Journal of Applied Physics 97, 083520 (2005), "Phase-change recording materials with a growth-dominated crystallization mechanism: A materials overview", L. van Pieterson, M. H. R. Lankhorst, M. van Schijndel, A. E. T. Kuiper, and J. H. J. Roosen, 1-7 pages.

* cited by examiner

PROGRAMMABLE VIA STRUCTURE FOR THREE DIMENSIONAL INTEGRATION TECHNOLOGY

STATEMENT OF GOVERNMENT INTEREST

This invention was made with U.S. Government support under Government Contract No.: N66001-04-C-8032, awarded by the Defense Advance Research Projects Agency (DARPA). The U.S. Government has certain rights in this invention.

BACKGROUND

The present invention relates generally to field programmable circuits as related to three-dimensional integration and, more particularly, to a programmable via structure suitable for use in three-dimensional integration technology.

Traditionally, application specific integrated circuit (ASIC) devices have been used in the integrated circuit (IC) industry to reduce cost, enhance performance or meet space constraints. The generic class of ASIC devices falls under a variety of sub classes such as custom ASICs, standard cell ASICs, Gate Array, and Field Programmable Gate Array (FPGA), wherein the degree of user allowed customization varies.

In recent years, there has been a move away from custom, semi-custom and Gate Array ICs toward field programmable components whose function is determined not when the integrated circuit is fabricated, but by an end user "in the field" prior to use. Off the shelf FPGA products greatly simplify the design cycle and are fully customized by the user. These products offer user-friendly software to fit custom logic into the device through programmability, and the capability to tweak and optimize designs to improve silicon performance. While such programmability is expensive in terms of silicon real estate, it reduces design cycle time, time to solution (TTS) and upfront non-recurring engineering (NRE) costs to the designer.

Reconfigurable circuits, such as FPGAs, are also anticipated to play a significant role in the new Three Dimensional Integration (3DI) technology currently under development. In planar circuit technologies (i.e., the individual circuit elements are formed on a single, planar substrate), an FPGA 100 (as shown in FIG. 1) is characterized by a set of simple, configurable logic blocks 102 arranged in an array with interspersed switches 104 that can rearrange the interconnections between the logic blocks 102.

In contrast, 3DI structures (such as shown in FIG. 2) consist of multiple semiconductor layers (DL1, DL2, etc.) that are interconnected in a vertical direction. In a multilayer logic network, this three-dimensionality may be exploited to increase density without reducing feature size, and reduce the line of flight interconnect path between logic elements. Optimal communication efficiency can thus be achieved in this context by introducing reconfigurable interconnects. Reconfigurable interconnects also offer the possibility for multi-use chips, thereby enabling compatibility with different communication protocols. Moreover, technologically disparate multilayer structures can form unique, single-chip combinations such as (logic+memory), (logic+optical communications) and (logic+sensors), for example. In these types of multicomponent/multilayer systems, reconfigurable connections are therefore needed to provide the controllable logic functionality, memory element repair and data encryption, etc.

Existing field-programmable logic and memory repair technology utilizes several methods to physically make/break the connections between logic blocks; unfortunately, none of these existing methods provides a fully adequate solution to the requirements of a 3DI application. For instance, a laser-fusible link is an early approach, but has now replaced by electrical techniques entirely internal to the chip. Electromigration fuses, such as those in IBM's eFUSE technology for rerouting chip logic, are also currently in use. However, an electromigration fuse takes up a large circuit area and requires a high current to blow the fuse. Moreover, the process is "one-shot," i.e., once the fuse is blown, it cannot thereafter be returned to a conducting state. Further, the distribution of eFuse characteristics is relatively broad, requiring that the state of each fuse be sensed by a discriminating circuit with the digital result stored in a latch.

Another existing approach for FPGA is the use of flash bits to control a pass transistor for each interconnection. A flash bit takes up space in the logic level, is formed by a process that is incompatible with standard CMOS processing, and requires a special high voltage to charge the gate oxide. As compared to a laser-blown fuse or an eFuse, the flash approach is considered limited multi-shot technique (e.g., about 20,000 reversals).

An anti-fuse approach used for some DRAM repair typically involves a very thin dielectric material such as silicon dioxide, or the sandwich combination silicon oxide-nitride-oxide (ONO), between two conductors. The anti-fuse is programmed by applying a relatively high voltage through the conducting terminals, thus causing dielectric breakdown in the dielectric. As a result, the resistance of the anti-fuse permanently changes from high to low. Accordingly, this represents another example of a one-shot technique, one that requires a high voltage.

The controllable link technologies described above do not have optimal properties for programmable logic applications in 3DI (or even for planar applications for that matter). In particular, a dependency on the use of high voltages (whether for gate charging in flash bit applications or for dielectric antifuses) is undesirable. In the case of flash bits, their presence in the logic level real estate may cause process incompatibilities, as described above. Electromigration fuses driven by relatively high current are large-area, require undesirably high power, and require an additional discriminator and latch circuitry. Furthermore, devices incorporating static RAM latches are subject to soft error arising from alpha particles or cosmic rays, which in a 3DI application may also have the effect of randomly altering the logic configuration. With the exception of flash bit technology (which has limited multi-shot capability), conventional fuse-based approaches are one-shot.

Accordingly, it would therefore be desirable to be able to configure a programmable link for a 3DI application that does not require high current or voltage to program, that is compatible with standard CMOS processing at the device level, that avoids the need for an SRAM latch to minimize space and avoid soft errors, and that is reprogrammable for a significant number of multiple instances (i.e., not single-shot).

SUMMARY

The foregoing discussed drawbacks and deficiencies of the prior art are overcome or alleviated by a programmable link structure for use in three dimensional integration (3DI) semiconductor devices. In an exemplary embodiment, the structure includes a via filled at least in part with a phase change material (PCM) and a heating device proximate the PCM. The heating device is configured to switch the conductivity of a transformable portion of the PCM between a lower resistance crystalline state and a higher resistance amorphous state.

Thereby, the via defines a programmable link between an input connection located at one end thereof and an output connection located at another end thereof.

In another embodiment, a method for programming a programmable link structure of a three dimensional integration (3DI) semiconductor devices includes passing a current through a heating device, the heating device proximate a via filled at least in part with a phase change material (PCM), the via thereby defining a programmable link between an input connection located at one end thereof and an output connection located at another end thereof. The heating device is configured to switch the conductivity of a transformable portion of said PCM between a lower resistance crystalline state and a higher resistance amorphous state.

BRIEF DESCRIPTION OF THE DRAWINGS

Referring to the exemplary drawings wherein like elements are numbered alike in the several Figures.

DETAILED DESCRIPTION

Disclosed herein is a programmable via structure suitable for use in 3DI technology. Briefly stated, a phase change material (PCM) is incorporated into a programmable via structure wherein the conductivity of the via is altered by a thermal SET or RESET process that changes the crystal properties of the PCM, and therefore the conductivity of the same. Thus configured, the PCM-based programmable vias provide such desirable advantages as, for example: spatial compactness, the elimination of a need for latches, multiple-shot reprogrammability, immunity from soft errors, and the elimination of the need for high voltage/current/power switching capability. Such advantages in turn provide improved function and lower costs in 3D applications. As will be further appreciated, the advantages of PCM programmable vias are not necessarily limited to 3DI structures, but rather the PCM programmable links may also be used in planar silicon environments so as to provide an alternative to FPGA.

As described in further detail, a PCM programmable via is formed within the metal layers of a semiconductor device, and may have a standard via cross section for the particular node (e.g., about 0.2 μm×0.2 μm). The PCM via material may be switched between resistive and conductive states by using an external heating element operated in a programmed heat cycle. The power requirement for switching of the PCM from a non-conductive, amorphous state to a conductive, crystalline state (and vice versa) is within available line voltage supplies. In addition, because the "on" and "off" impedances are suitable for direct interfacing with logic inputs, no latch devices are required. Furthermore, the PCM via structure may be reprogrammed a very large number of times (e.g., PCM memory elements test up to on the order of about $10^{11}$ cycles).

In one embodiment, the phase change material (PCM) is a ternary alloy of germanium (Ge), antimony (Sb) and tellurium (Te) (hereinafter referred to as "GST"), with an exemplary composition of $Ge_2Sb_2Te_5$; however, other compositions such as $GeSb_4$, (including substitution/addition of other elements) are also possible for the PCM. Table I below illustrates a comparison of resistivity, specific heat and thermal conductivity of various insulative, conductive and phase change materials associated with via level materials in a semiconductor device:

TABLE I

Resistivity, Specific Heat and Thermal Conductivity of Key Materials

| Material | $\rho(\Omega \cdot cm)$ | $C_p(J/(K \cdot cm^3))$ | $K(J/(K \cdot cm \cdot sec))$ |
|---|---|---|---|
| $SiO_2$ | | 3 | 0.013 |
| TaSiN | $4 \times 10^{-4}$ | | 0.02 |
| $Ge_2Sb_2Te_5$ (crystalline) | 0.04 * | 1.3 | 0.005 |
| $Ge_2Sb_2Te_5$ (amorphous) | $8 \times 10^3$ * | 1.3 | 0.0017 |
| $GeSb_4$ (crystalline) | $5 \times 10^{-4}$ | | |
| $GeSb_4$ (amorphous) | 1.0 | | |

* 12% N-doping

Figure 1:
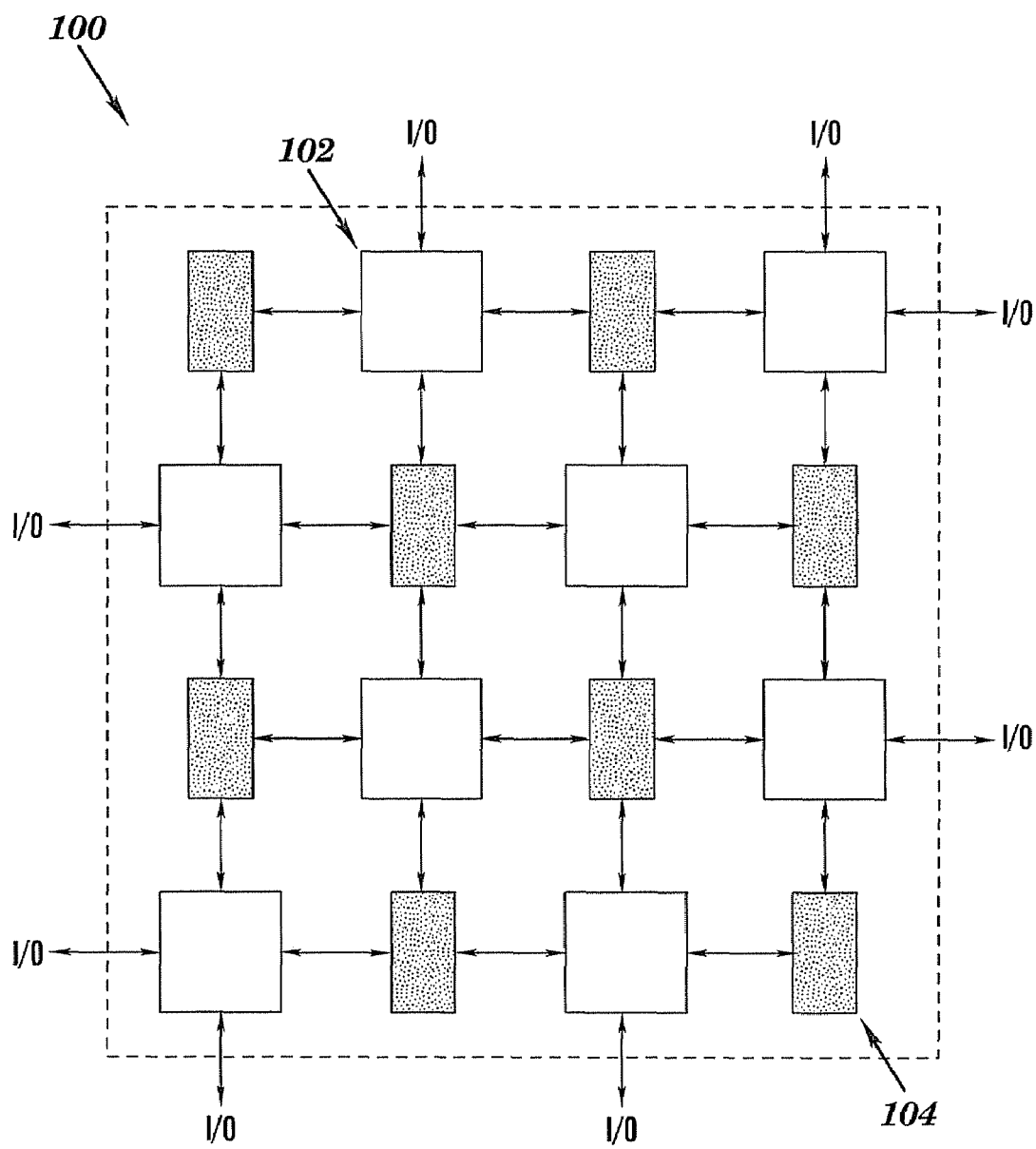
FIG. 1 is a schematic diagram of an FPGA used in planar circuit technologies.
Figure 2:
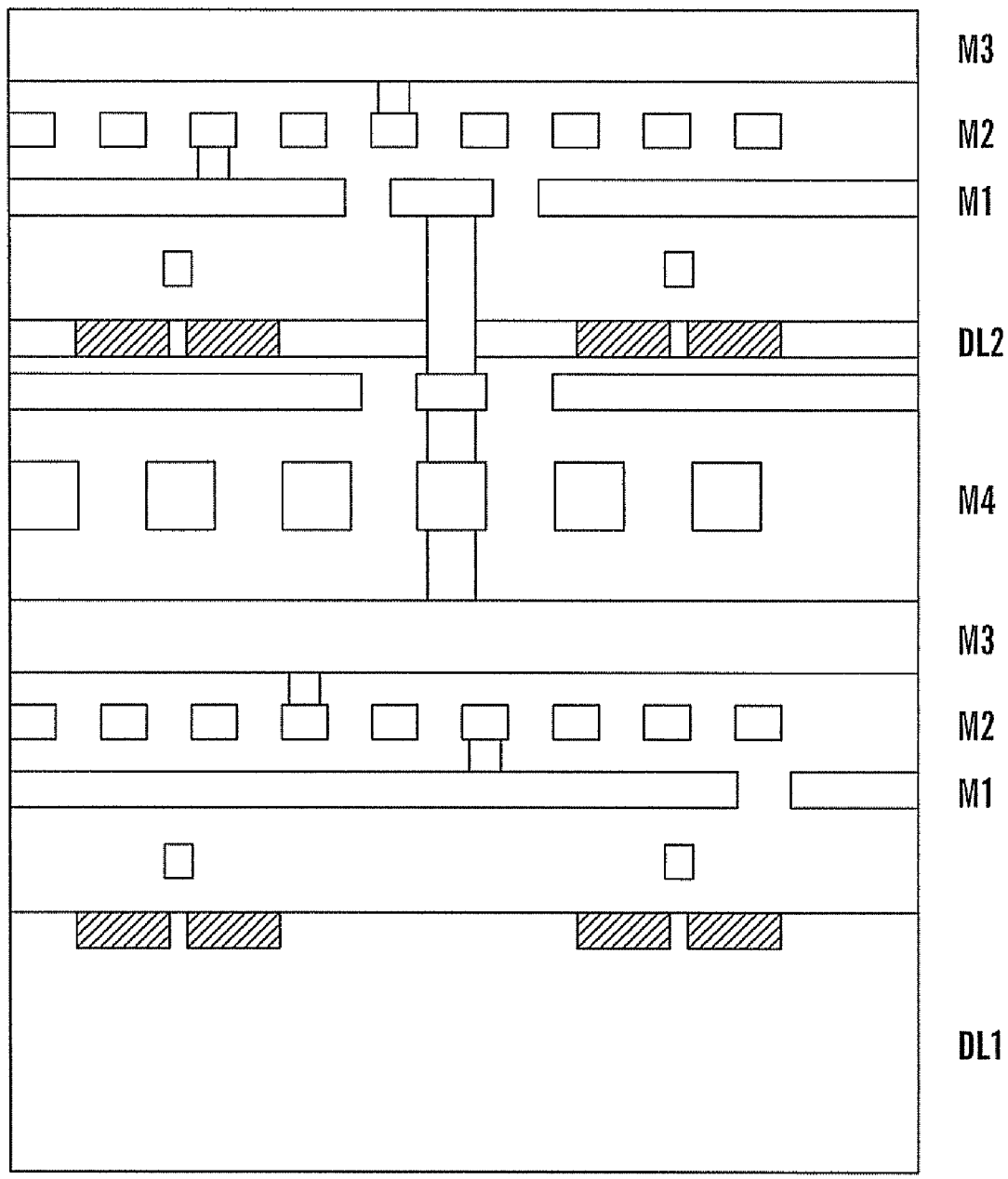
FIG. 2 is a cross sectional view of an exemplary three dimensional integrated circuit.
Figure 3:
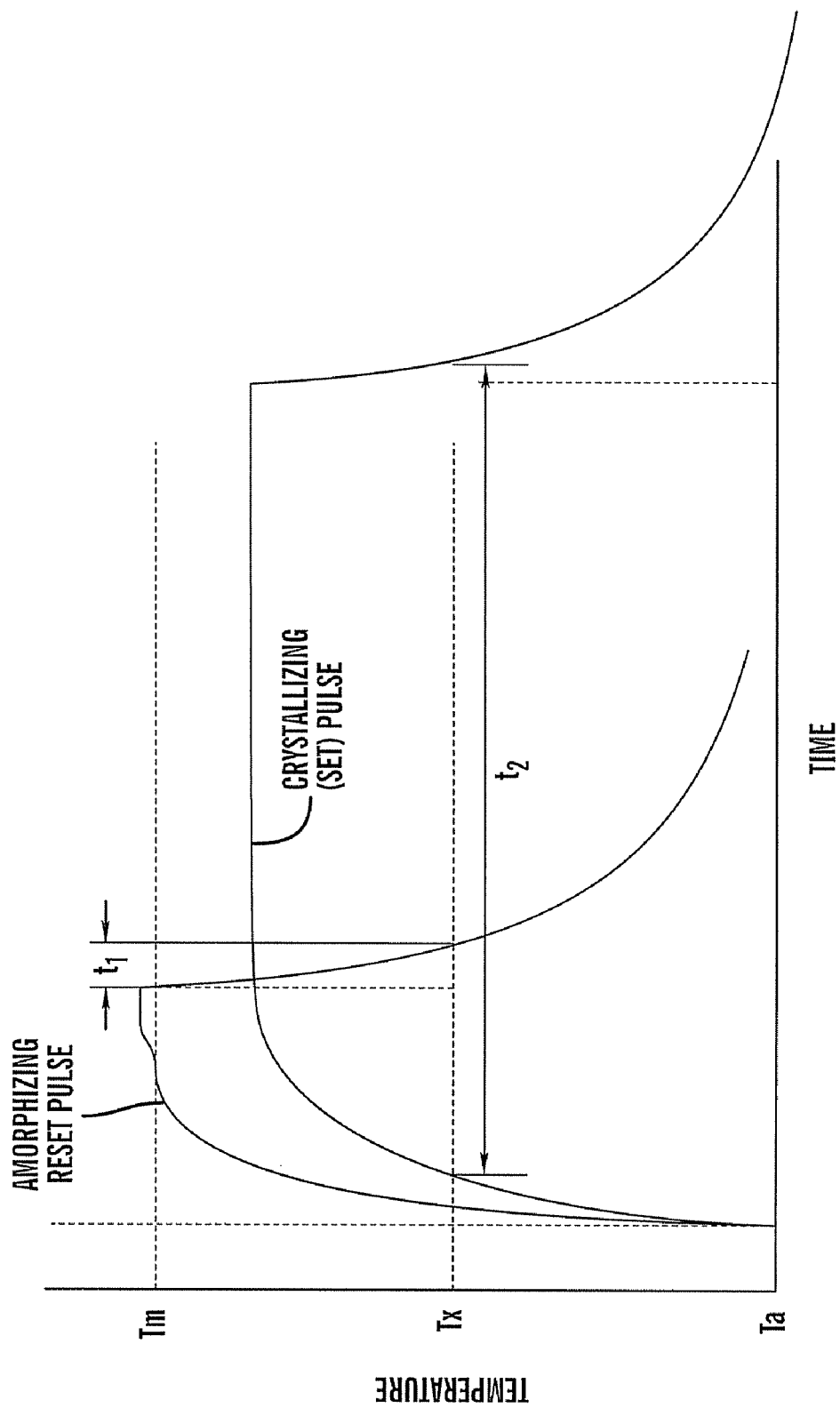
FIG. 3 is a graph illustrating exemplary thermal cycling operations of a phase change material used in a programmable via, in accordance with an embodiment of the invention.

At room temperature (and up to moderately elevated temperatures), the PCM material is stable in two phases: a crystalline phase which is a moderately good conductor of electricity, and an amorphous phase which is insulating as shown in Table I. Thus, in the crystalline phase, the state of a PCM link is "on," while in the amorphous phase the state is "off." The phases are switched from one to another by one of two thermal cycling operations as illustrated in FIG. 3. More specifically, the thermal cycling includes a "RESET" pulse for converting the PCM from crystalline to amorphous form, and a "SET" pulse for converting the PCM from amorphous to crystalline form. During the RESET pulse, the temperature of the PCM is raised above its melting temperature ($T_m$), followed by a rapid quench over a short time $t_1$. As a result of the rapid quench, the disordered arrangement of atoms of the PCM due to the melt is retained. Thus, the PCM is left in an amorphous, high resistive state after the RESET pulse. During the SET pulse, the PCM is annealed at a lower temperature with respect to the melting temperature, and for a longer time $t_2$ with respect to $t_1$. This process enables the amorphous form to crystallize into a lower resistive state.

Figure 4:
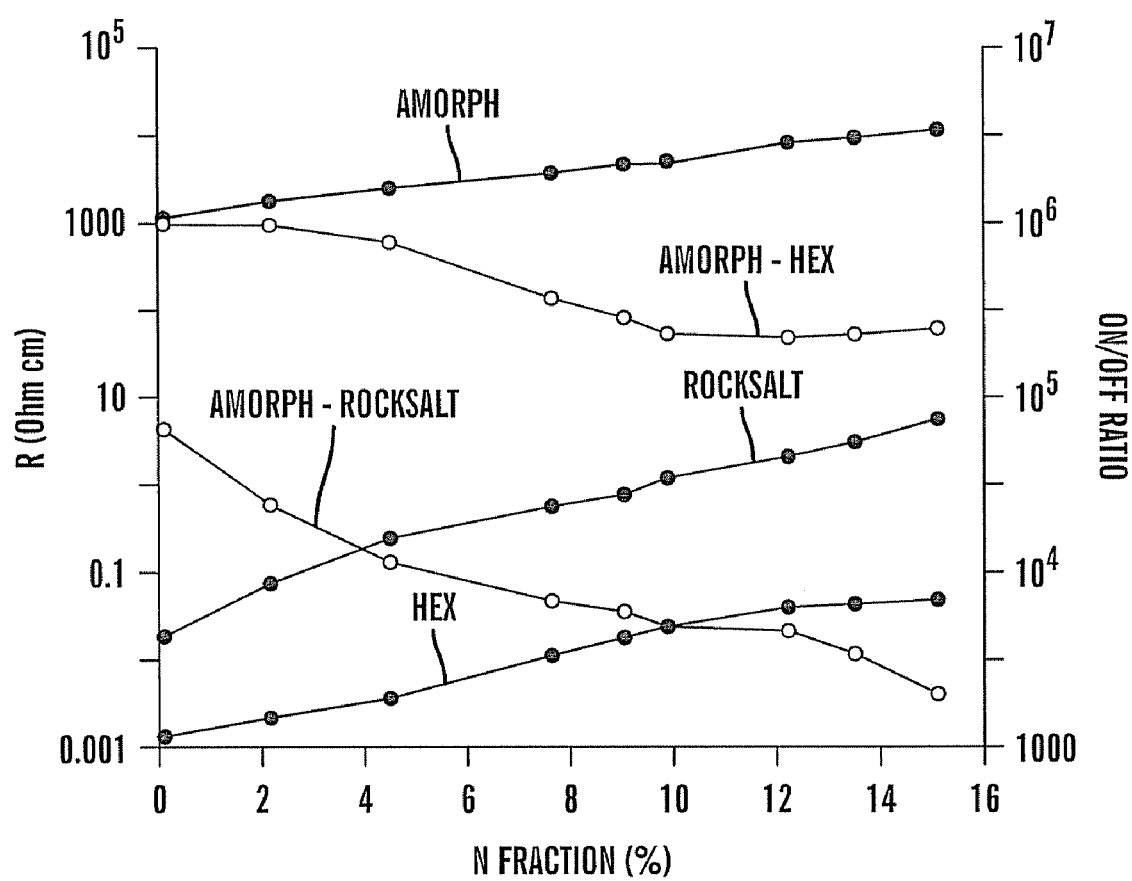
FIG. 4 is a graph illustrating the resistivity of the various states of $Ge_2Sb_2Te_5$, as a function of nitrogen doping.

As also indicated above, the ternary GST alloy is nitrogen doped in order to raise the crystallization temperature thereof, so that the material remains bistable at an operating temperature of approximately 85-95° C. In other words, it is undesirable for the GST alloy to be susceptible to phase change once programmed, where the circuit is operating at temperatures normally designed for. FIG. 4 is a graph illustrating the resistivity of the various states (amorphous, amorphous-rocksalt, hex crystalline) of $Ge_2Sb_2Te_5$, as a function of nitrogen doping. As $GeSb_4$ also has a more elevated crystallization temperature than undoped $Ge_2Sb_2Te_5$, this PCM material need not be doped.

Referring generally now to FIGS. 5 through 10, several possible embodiments of a programmable via structure (incorporating a PCM) are illustrated. As indicated above, the vias therein may have the standard cross section $\alpha_{via} \times \alpha_{via}$ at a particular node (e.g., $\alpha_{via}$=0.2 µm) or lower, and may be comprised wholly or partly of phase change material (PCM). A heater used to implement the SET and RESET operations includes a thin layer (e.g., thickness on the order of about $t_h$=20 nm) of a refractory material such as TaSiN, which has a relatively high resistivity (on the order of about $\rho$=400 µΩcm, depending on composition), and a relatively low thermal conductivity (on the order of about 0.01-0.02 J/(K·cm·sec)). Heating is accomplished by passing a pulse of current through the heater in the horizontal plane. During RESET (quench from melt), a thin region of the PCM adjacent to the heater surface is melted and transformed to the amorphous phase. This thin region corresponds to the transformable part of the via material.

Figure 5A:
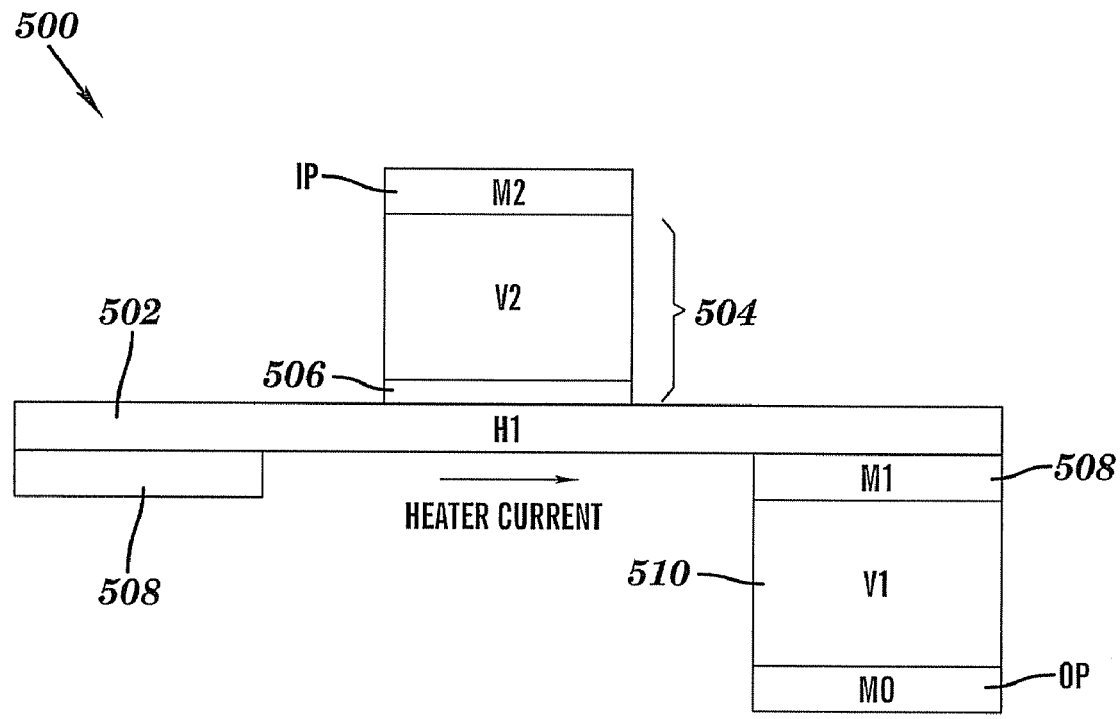
FIGS. 5(a) and 5(b) are a cross sectional view and a top view, respectively, of a first embodiment of a programmable via structure for semiconductor devices.
Figure 5B:
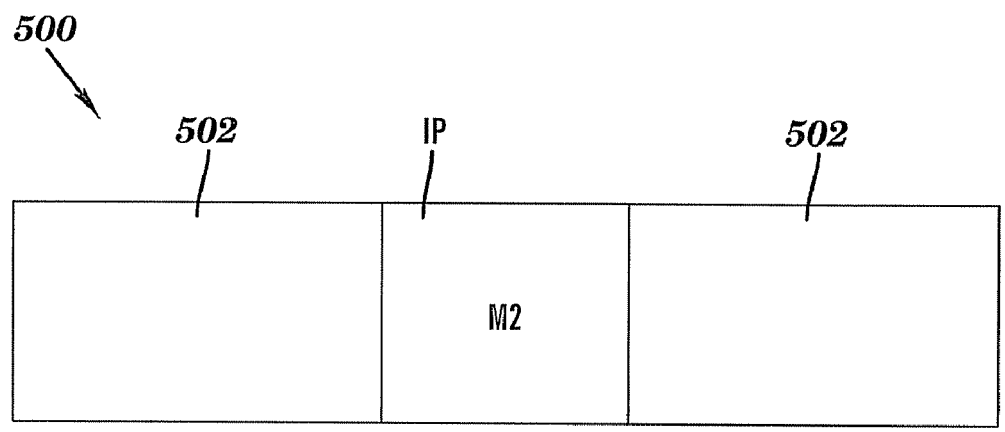

As particularly shown in FIGS. 5(a) and 5(b), a first embodiment of a programmable via structure 500 includes a heater 502 deposited as a film (e.g., TaSiN) on an insulator material (such as $SiO_2$ for example). The heater material preferably has a thermal conductivity on the order of about 0.01-0.02 J/(K·cm·sec) or lower, and forms a planar interface with the bottom of a PCM via 504. In this geometry, the transformable part 506 of the via 504 material forms a very thin layer (e.g., having thickness on the order of about $t_{transf}$=4 nm, or larger) adjacent to the heater surface. When the via 504 is in the "off" state, the resistance of the thin layer 506 constitutes the "off" resistance of the via. When the via 504 is in the "on" state, the whole length of the via 504 plus a part of the heater 502 forms the "on" resistance. These resistances are key to the via function, and are estimated below.

In the first embodiment of FIGS. 5(a) and 5(b), the heater power supply current path is through metal contacts 508 disposed on opposite sides of the heater 502 with respect to the PCM interface. Such a design permits a TaSiN lead length (external to the PCM material) of one half the via width. As also shown in the embodiment of FIGS. 5(a) and 5(b), the programmable via structure provides a programmable link between an input connection (IP) located at an upper metal level (M2) and an output connection (OP) located at a lower metal level (M0), thus enabling a programmable configuration between distinct semiconductor layers in a 3D structure. In this instance, the heater contacts 508 are disposed at an intermediate metal level (M1) between M2 and M0. A conventional via 510 (e.g., filled with tungsten) is used to connect M1 to M0.

In most cases (except for a later embodiment presented hereinafter; FIG. 9, and a variant of FIG. 10) the heater circuit is assumed to be isolated and floating when the heater is not operative. Its effect on the via 504 during logic operation is thus a small parasitic capacitance. As illustrated in a later embodiment, if it becomes desirable to electrically insulate the heater 502 from the via 504, a very thin intervening oxide layer may be included therebetween (e.g., having a thickness on the order of about 5 nm).

Figure 6:
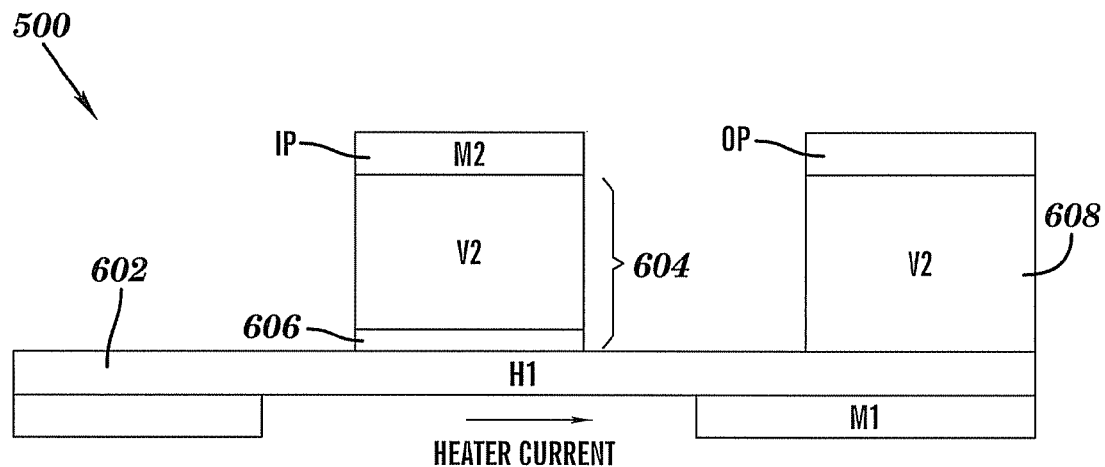
FIG. 6 is a cross sectional view of a second embodiment of a programmable via structure for semiconductor devices.

FIG. 6 illustrates a second embodiment of a programmable via structure 600. Similar to the embodiment of FIG. 5, the via structure 600 includes a heater 602 forming a planar interface with the bottom of a PCM via 604. In this embodiment, both the input connection (IP) the output connection (OP) are located at the same metal level (M2), enabling programmable configuration within a single semiconductor layer of the structure. When the transformable portion 606 of the PCM via 604 is in the "on" state, the connection path runs from IP, down through PCM via 604 and the heater 602, and back up through a conventional via 608 to OP.

Figure 7A:
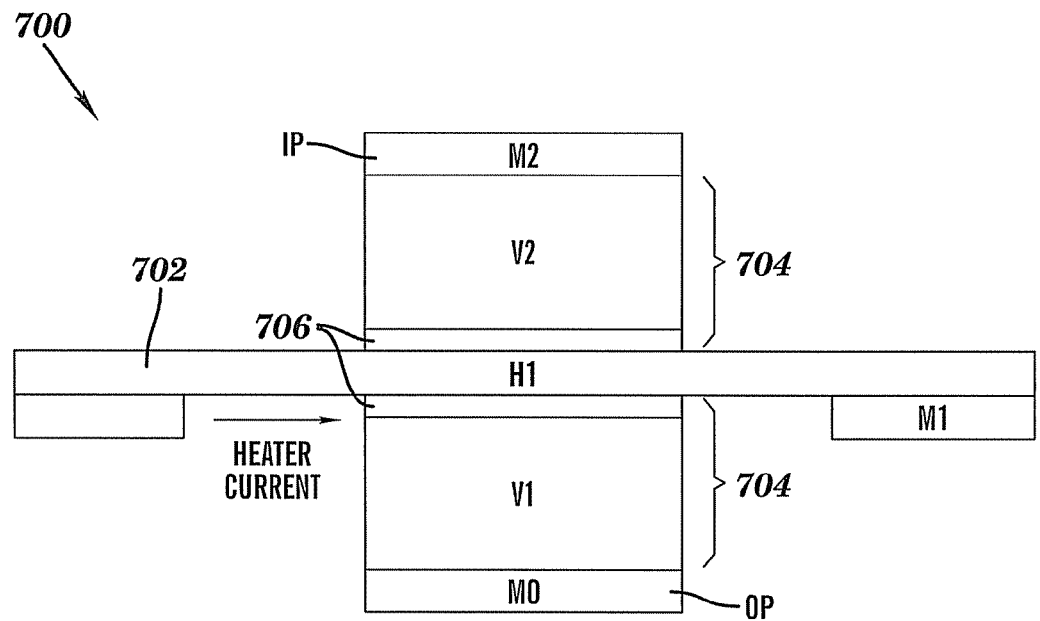
FIGS. 7(a) and 7(b) are cross sectional views of a third embodiment of a programmable via structure for semiconductor devices.
Figure 7B:
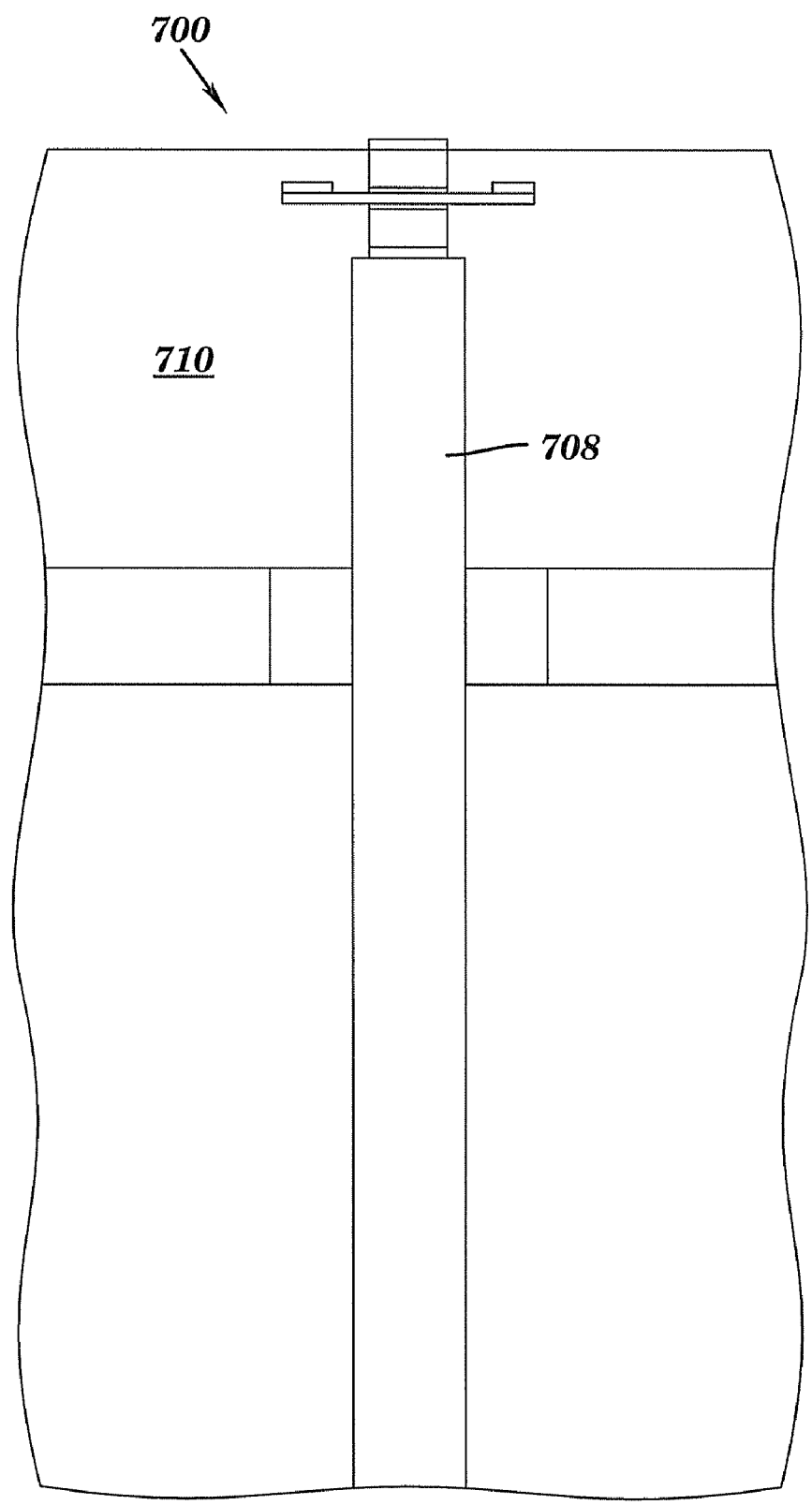

FIG. 7(a) illustrates a third embodiment of a programmable via structure 700. As is shown, the heater 702 is sandwiched between upper and lower sections of the PCM via 704. Because of the very low thermal conductivity of GST, this embodiment utilizes less switching power with respect to the embodiment of FIG. 6. Here, the "off" resistance is defined by the two thin transformable layers 706 in series (in the amorphous state), while the "on" resistance is that of the entire 704 via in its crystalline phase, including a negligible contribution from the heater 702, due to its geometry. Similar to the embodiment of FIG. 5, the connection path (when the via 704 is programmed "on") runs from the input connection (IP) located on upper metal level M2 down to the output connection (OP) located on lower metal level M0. The heater current path runs through intermediate metal level M1. In FIG. 7(b), an example of how the programmable structure of FIG. 7(a) is located with respect to a metal interconnect 708 within a 3DI structure 710 is illustrated.

Figure 8:
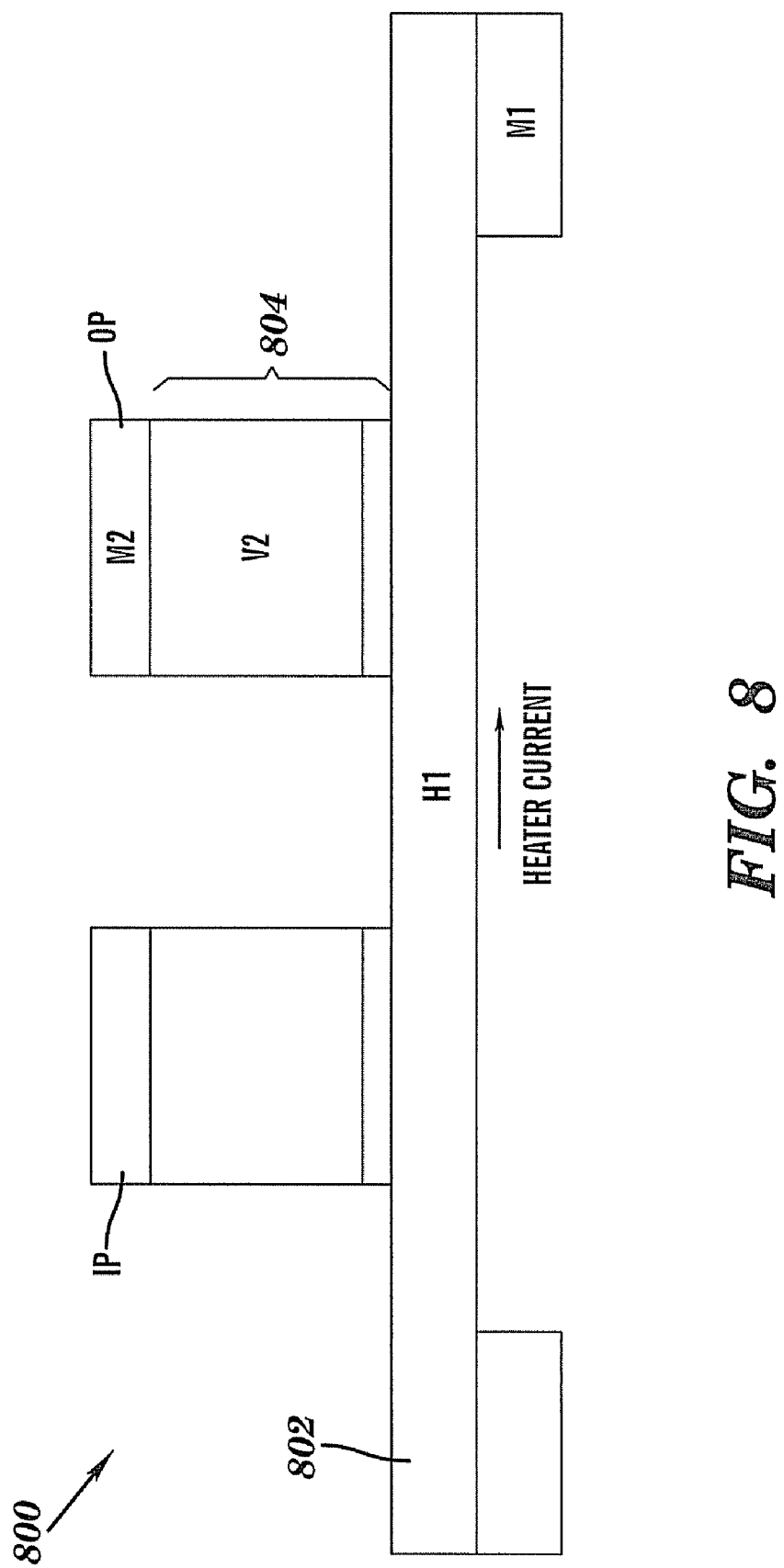
FIG. 8 is a cross sectional view of a fourth embodiment of a programmable via structure for semiconductor devices.

FIG. 8 illustrates a fourth embodiment of a programmable via structure 800, having characteristics of the embodiments of FIGS. 6 and 7. Similar to FIG. 6, the input and output connections lie within the same metal level. However, similar to FIG. 7, the via 804 connected to the output contact OP is also a PCM via. It will be noted that (as opposed to the embodiment of FIG. 6), the second heater contact at M1 does not lie directly beneath the PCM via connected to OP. This prevents the contact metal at M1 from drawing excessive heat from the portion of the heater 802 in contact with the PCM via 804.

Figure 9A:
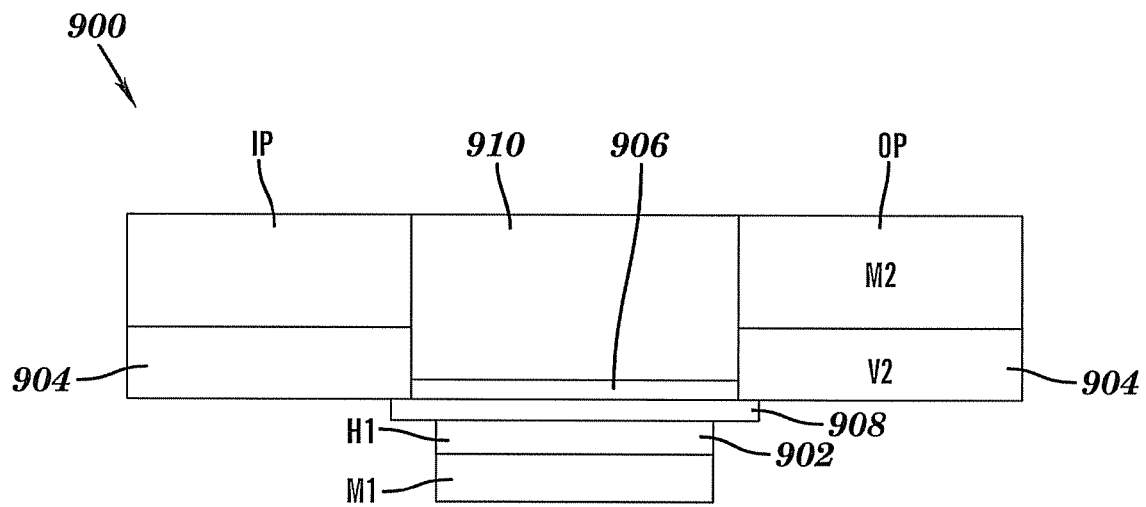
FIGS. 9(a) and 9(b) are a cross sectional view and a top view, respectively, of a fifth embodiment of a programmable via structure for semiconductor devices.
Figure 9B:
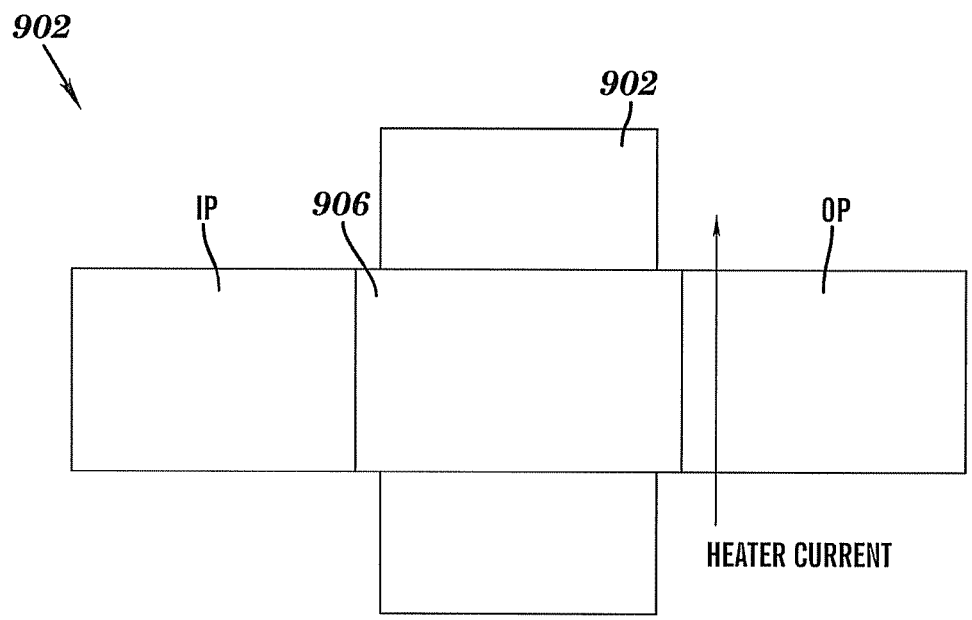

FIGS. 9(a) and 9(b) illustrate a fifth embodiment of a programmable via structure 900, which also enables programmable configuration within a single semiconductor layer in a 3D structure. In this embodiment, however, the program current path flows longitudinally in the transformable PCM layer 906 between adjacent crystalline portions 904. The heater 902 (unlike the previous embodiments) is not actually a part of the programmed path between IP and OP. Thus, a thin insulating layer 908 (e.g., an oxide on order of about 2-5 nm in thickness) is disposed between the heater 902 and the PCM for electrical isolation, but is not thick enough to significantly affect thermal operation. As a result, the embodiment of FIG. 9 eliminates the need for electrical isolation of the heater circuit during logic operation. Moreover, as the electrical resistance of the link is relatively high (given the direction of current through PCM material), this configuration of the via structure 900 is well-suited for a PCM material with a low resistivity, such as binary $Ge_xSb_{1-x}$, (recalling from Table I that the resistivities $\rho$ for $GeSb_4$ are: crystalline phase, $\rho=5\times10^{-4}$ Ω·cm, amorphous phase, $\rho=1$ Ω·cm).

The insulating layer 910 on top of the transformable section of PCM 906 and between the input and output contacts is selected so as to have a low thermal conductivity (e.g., 0.002-

0.007 J/(K·cm·sec)) for satisfactory operation. One suitable material in this regard is NBLOK (nitrogen doped silicon carbide).

Figure 10A:
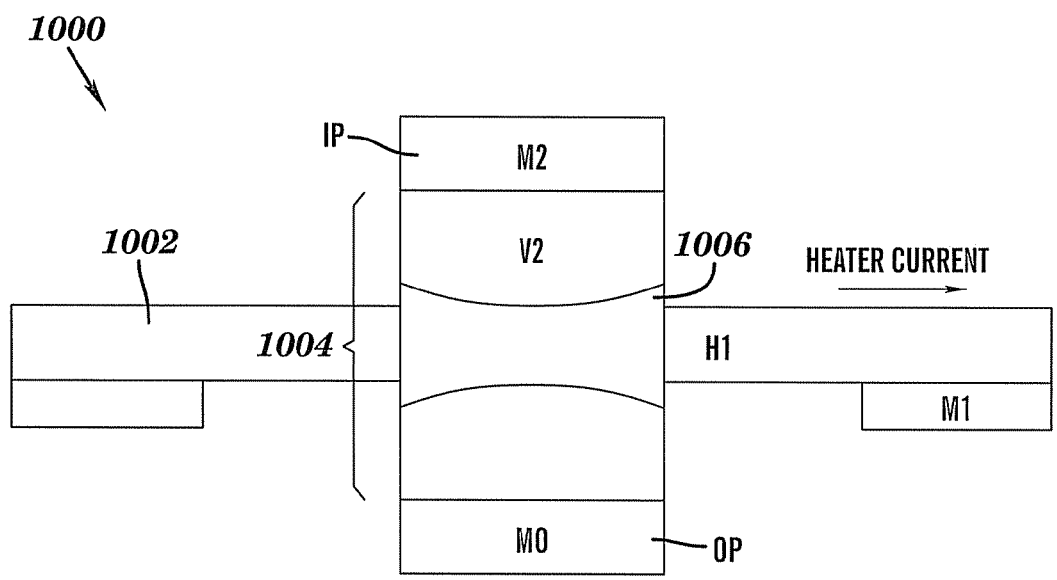
FIG. 10 is a cross sectional view of a sixth embodiment of a programmable via structure for semiconductor devices.
Figure 10B:
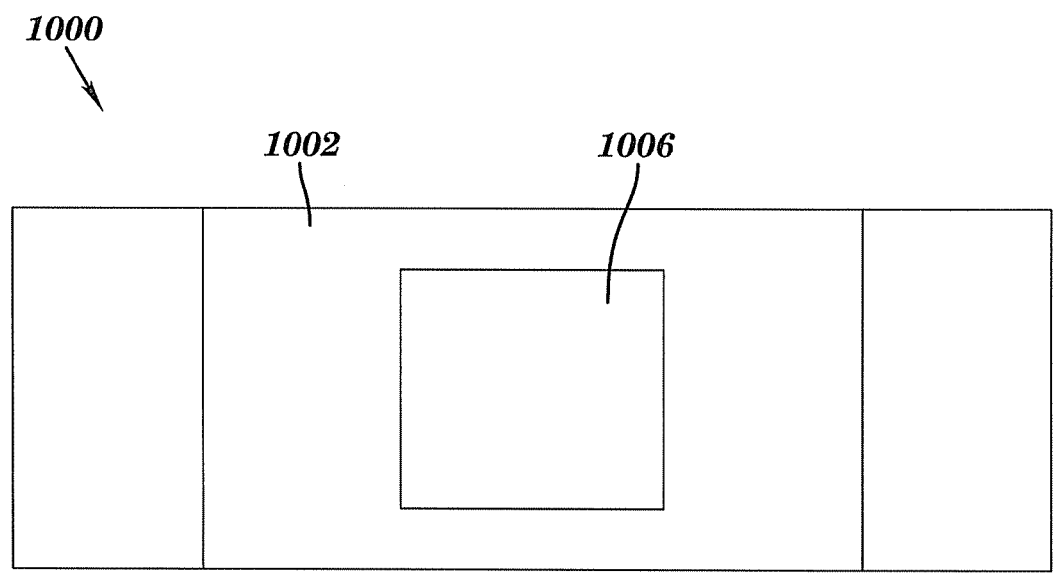

FIGS. 10(*a*) and 10(*b*) illustrate a sixth embodiment of a programmable via structure 1000. Instead of having separate layers of transformable PCM material on opposite sides of the heater 1002, the transformable portion 1006 of the PCM via 1004 is instead passed through an opening formed in the heater film is illustrated, as perhaps best illustrated in FIG. 10(*b*). In this embodiment, the volume of transformable PCM 1006 is significantly larger than in the devices with a planar heater interface, requiring longer thermal cycle times. The "off" resistance is also comparatively larger, due to the thicker region of amorphous PCM, while the "on" resistance is again that of the entire via 1004 in crystalline phase. Although not specifically shown in FIGS. 10(*a*) and 10(*b*), a thin insulating layer could be formed around the perimeter of the opening made in the heater 1002 so as to electrically isolate the heater circuit from the program circuit.

For each of the above described embodiments, using both the geometry of the designs and the material properties shown in Table I, the "on" and "off" resistances of the embodiments may be estimated approximately, as shown in Table II below:

TABLE II

ON and OFF Resistances for different Design Configurations

| Figure # | x, y, z in $Ge_xSb_yTe_z$ | $R_{on}$ (KΩ) | $R_{off}$ (MΩ) |
|---|---|---|---|
| 5 | 2, 2, 5* | 2.2 | 8 |
| 6 | 2, 2, 5* | 2.2 | 8 |
| 7 | 2, 2, 5* | 2.0 | 16 |
| 8 | 2, 2, 5* | 2.4 | 16 |
| 9 | 1, 4, 0 | 1.2 | 24 |
| 10 | 2, 2, 5* | 2.0 | >20 |

*12% N-doping

The above approximations further take into account a via square cross-ion section with dimension $\alpha_{via}$=0.2 μm, a total via height $h_{via}$=0.2 μm, a thickness of transformable PCM layer, $t_{transf}$=4.0 nm or larger, and a spacing between vias $d_{via}$=0.2 μm.

Figure 11:
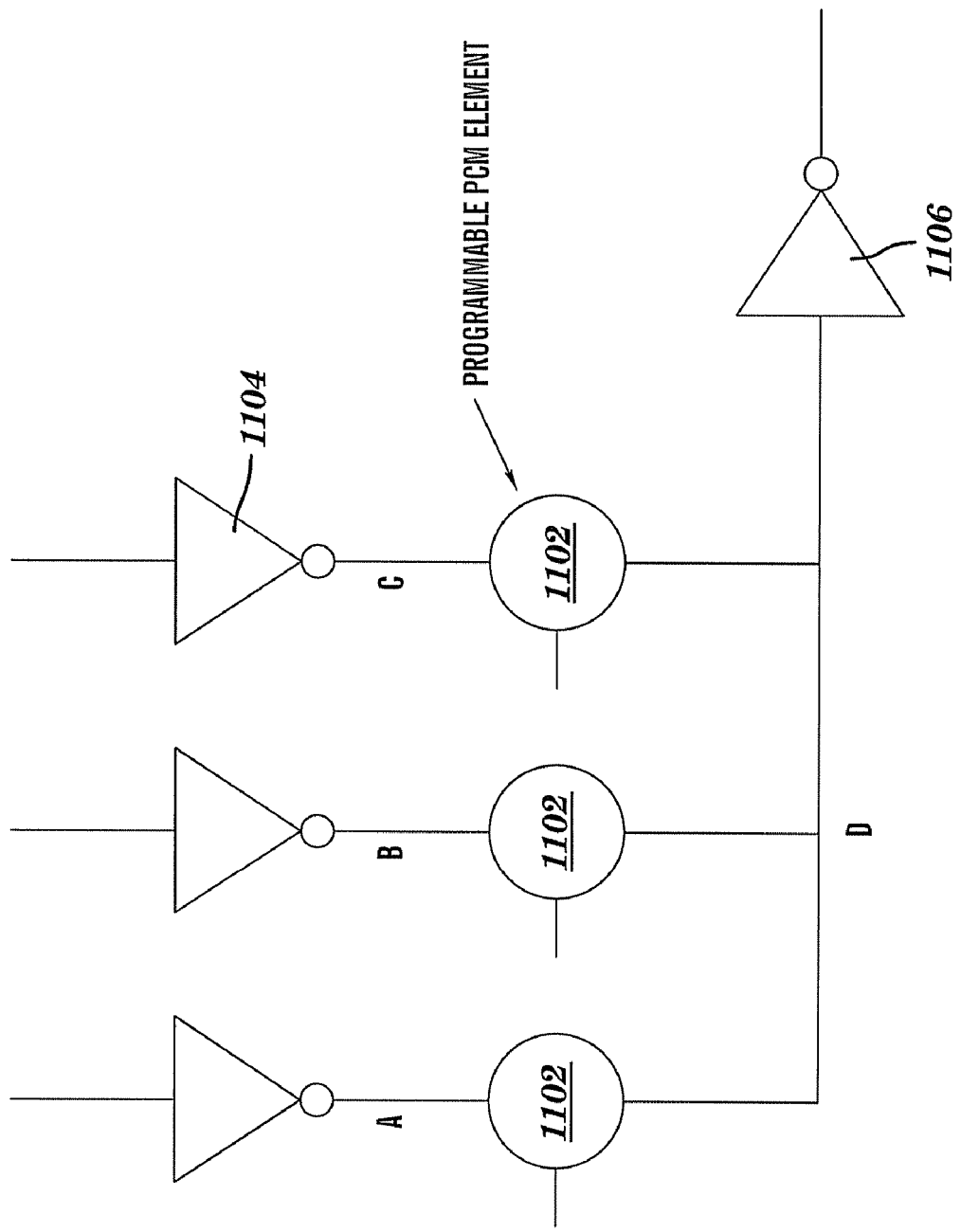
FIG. 11 is an exemplary logic structure using programmable vias, illustrating consideration of "on" and "off" resistance parameters.

The "on" and "off" resistance requirements are appreciated upon consideration of a logic configuration such as shown in FIG. 11. In this example, the PCM elements 1102 in lines A and B are in the amorphous, high resistance configuration, while the PCM element 1102 in line C is in the crystalline, low resistance state. The inverter 1104 in line C drives the output inverter 1106 at line D through the "on" PCM link, which must have a low enough resistance to support a correct logic state and timing. The PCM "on" link resistances in Table I are on the order of about 1 KΩ, as is required to satisfy this condition in CMOS logic. However, in a performance-related path, where the PCM via "on" resistance is such as to degrade performance, a buffer (not shown) may be inserted.

In evaluating the "off" link resistance, it is assumed that inverter outputs A and B are logically low, and that inverter output C is high. In this case, inverter 1104 is (through line D) driving two "off" PCM vias in parallel. This should be a light load in order to maintain CMOS functionality. It is also desirable for this path to draw as small a parasitic current as possible. The relatively high "off" resistances indicated in Table I should ensure these conditions adequately. Thus, the programmable via designs along with the chosen materials should be embeddable in CMOS logic without requiring additional latches. Timing studies may be performed in order to take into account the parasitic capacitance of the heater circuits, except for the embodiment of FIG. 9, where the capacitance of the thin oxide layer is relevant.

Processing Operations

Referring once again to the programmable via structures of FIGS. 5 through 10, exemplary processing operations for forming the same are now discussed. Generally, each begins with a substrate material, such as silicon. A thermally and electrically insulating layer such as $SiO_2$, for example, (about 200 nm in thickness) is then deposited. The thermal conductivity of the insulating layer is preferably in the range of about 0.01-0.02 J/(K·cm·sec) or less, and the material should be temperature-stable in the device operating range.

In the embodiment of FIG. 5, the bottom contact layer M0 (e.g., W or Cu) is deposited on top of a thermally and electrically insulating layer (e.g., $SiO_2$). After patterning the M0 layer, an oxide is deposited. The $SiO_2$ is patterned to align via V1 (e.g., about 0.2×0.2 μm) with the M1 level, which again represents the metallization level for the heater. The contact vias at M1 may be filled with a suitable metal such a tungsten, for example. Following a suitable planarizing step, a refractory metal (H1) layer (e.g., about 20 nm in thickness) is deposited. This refractory metal layer (e.g., TaSiN, NiCr, or doped $CrO_x$) is then patterned as an external heater. Another planarization (CMP) step may be utilized to insure a "flat" interface between the subsequently formed PCM and the heater layer H1. The heater formation is followed by a deposition of $SiO_2$ which is patterned to make a via (e.g., about 0.2×0.2 μm) to be filled with PCM (including suitable adhesion and capping layers at the opposite ends of the PCM plug, such as Ti/TiN). The top metallization layer M2 is then deposited and patterned to make contacts to the filled vias. In this structure, the V1 contact vias are configured to connect to the bottom logic layer in the 3DI scheme.

In the embodiment of FIG. 6, the metallization level M1 is deposited directly on top of $SiO_2$ (without first building the M0 and V1 levels). This is followed by formation of the heater H1 level, where the interface for the next step should be planar. The oxide is then deposited and patterned with vias to be filled with PCM (with capping layers), and thereafter the operations are repeated to create conventional metallic vias, with both types of vias contacting the M2 level. The embodiments in FIGS. 5 and 6 are configured to minimize the length of the heater leads so as to optimize power requirements. It will be noted that the specific details of the heater driving circuits are omitted for purposes of simplicity.

In the embodiment of FIG. 7, the process flow is substantially the same as for FIG. 5. However, one difference is that the V1 via of FIG. 7 is filled with PCM, including the appropriate capping layers. PCM via V2, which is built after the planarization step following the deposition of the H1 heater layer, is connected to the V1 via underneath the heater. At this point, a CMP step is used to control the "flatness" of the interface between PCM and the next layer H1, and thus to control morphology of the melt front. This process will result in a symmetrical PCM via structure, interrupted by a heater in the middle thereof. After filling the V2 via with PCM and suitable top capping layers, contact is made to the M2 contact level.

In the embodiment of FIG. 8, the process flow is substantially the same as that for FIG. 6, except that both vias atop the heater level are PCM-filled. The processing for the embodiment shown in FIG. 9 is somewhat similar to that of FIG. 8, although a thin insulating layer (O1) may additionally be needed to electrically separate the H1 heater layer from the PCM (to ensure a desired ON/OFF ratio). The distinguishing feature of the FIG. 9 embodiment is the thin (e.g., about 5 nm)

PCM layer that forms a fully transformable PCM element bridging two crystalline PCM vias. This thin layer is first blanket deposited and patterned over a larger area encompassing the two vias in the programmable structure. A $SiO_2$ layer is then deposited and patterned with vias to be filled with PCM as described previously.

In the embodiment of FIG. 10, there are alternating PCM and heater material levels (PCM/H1/PCM) as is shown in FIG. 7. In this instance, however, following the M0 level formation, the subsequent level formation is as follows: M1, $SiO_2$, heater H1, and $SiO_2$. Then, the vias are formed by patterning and etching the entire $SiO_2$/H1/$SiO_2$ stack, followed by filling with the PCM. The top metallization (M2) level (e.g., using tungsten) will follow, as described above. In this structure, an insulating lining on the vias may be desirable to electrically isolate the heater from the PCM as stated above.

Alternatively, tungsten only may be used in the contact vias, and the metal lines are fabricated by damascene processing, using copper. For example, the process flow for the embodiment of FIG. 10 would involve first oxide deposition, patterning and RIE of the M1 layer, M1 plating and CMP, followed by defining the H1 layer, then another oxide deposition, deep multi-level RIE, PCM fill, and CMP.

Power Requirements

In the embodiments of FIGS. 5 through 9, the primary heat propagation direction is normal to the film plane along the direction z. For illustration purposes, diffusive heat propagation is first considered as a purely one-dimensional process in the z-direction. Three-dimensional simulations presented in a later section give a more accurate measure of the power requirements. For a semi-infinite medium of heat conductivity K and specific heat C per unit volume being heated at its surface located at z=0, starting at time t=0, the equation obeyed by temperature T(z,t) is the diffusion equation:

$$\frac{\partial T}{\partial t} = D \frac{\partial^2 T}{\partial z^2},$$

where the diffusion constant is $$D = \frac{K}{C}.$$

The solution for constant power W applied up to a switch-off time $t_0$ is given by:

$$T(z, t) = T_a + T_0 \sqrt{\frac{t}{t_0}} \left[ e^{-\varsigma^2} - \varsigma \sqrt{\pi} (1 - \text{erf}(\varsigma)) \right],$$

where $\varsigma = z/\sqrt{4Dt}$, $T_a$ is ambient temperature, and $T_0$ is the temperature rise at switch-off. The temperature evolution at the surface z=0 is given by:

$$T(0, t) = T_a + T_0 \sqrt{\frac{t}{t_0}},$$

and rises as the square root of time. The power is given by:

$$W = AT_0 \sqrt{\frac{\pi KC}{4t_0}},$$

where A is heater surface area in the xy-plane. Thermal properties of some of the key materials are given in Table I above.

Application of this formula to an area of $0.2 \times 0.2$ $\mu m^2$ ($\alpha_{via}$=0.2 $\mu m$), $T_0$=700 C, and $t_0$=2.0 ns, including the Table I parameters, gives (for heater powers into a semi-infinite medium): $W_G$=0.35 mW for GST, $W_O$=1.1 mW for $SiO_2$ (the relative magnitudes of $W_G$ and $W_O$ track the KC product, which is much smaller for GST than for $SiO_2$).

In considering the design of the FIGS. 5 and 6 embodiments, it is assumed for purposes of simplicity that the heater relatively rapidly equilibrates with the medium. For example, the internal heater heat diffusion time $$\tau_h = \frac{t_h^2 C_h}{4 K_h},$$

with $\tau_h$=20 nm, and assuming $C_h \approx 2$ $JK^{-1}cm^{-3}$, gives $\tau_h$=0.1 ns, which is very short compared with other times of interest. However, this will not necessarily be the case in all situations; 3D simulations confirm this fast equilibrium in a more realistic geometry. Estimated heat loss in the TaSiN 0.1 $\mu m$ leads, with a maximum temperature drop of 700° C. along the length, would be about 60 $\mu W$ per lead. However, in practice, the leads also heat up to nearly $T_0$, making the heat loss from the leads relatively low compared with the heater power. Hence, an approximate analysis may be made based on treating the heater as a sheet source of power with uniform power per unit area.

Proceeding on this assumption, the heater powers emitted from each side of the heater strip are summed to obtain the total heater power. In the structure of FIGS. 5 and 6, the effective heater strip length is taken as $2.0\alpha_{via}$. The values shown below in Table IIIa are then obtained for the required heater power for the designs of the embodiments in FIGS. 5 and 6.

In the embodiment of FIG. 7, the heat is dissipated partly into oxide on both sides, and partly into GST on both sides. The heater length is again taken as $2\alpha_{via}$, giving the result indicated in Table IIIa. A more accurate result is given in the section on 3D simulations, where this case is considered. The power required during the melt phase is 1.9 mW for a heater slab measuring $0.2 \times 0.2 \times 0.01875$ cubic microns.

In the embodiment of FIG. 8, the estimate is similar to that for FIGS. 5 and 6, except that there are two PCM vias and thus the heater length is taken as $4\alpha_{via}$, with a corresponding increase in heat lost to oxide. In FIG. 9, the estimate is similar to FIGS. 5 and 6. An estimate for the embodiment of FIG. 10 is given in a following section, where the 3D simulations of this case are presented; the result is 2.8 mW during the melt phase for a heater slab measuring $0.2 \times 0.2 \times 0.01875$ cubic microns.

TABLE IIIa

Estimated Power requirements for 0.2 μm PCM Vias

| Figure # | W (mW) | $R_h$ (KΩ) | I(mA) | V (V) |
|---|---|---|---|---|
| 5, 6 | 0.35 + 3 × 1.1 = 3.65 | 0.4 | 3.1 | 1.2 |
| 7 | 2 × 0.35 + 2 × 1.1 = 2.9 | 0.4 | 2.7 | 1.1 |
| 8 | 2 × 0.35 + 6 × 1.1 = 7.3 | 0.8 | 3.0 | 2.4 |
| 9 | 0.35 + 3 × 1.1 = 3.65 | 0.4 | 3.1 | 1.2 |

By way of comparison, the results shown in Table IIIb below are those corresponding to a via of width 0.1 μm and to a TaSiN heater composition with a resistivity about 10 times than indicated in Table I, with a PCM resistivity of about 0.25 times that in Table I to maintain the "on" and "off" impedances in Table II. Alternatively, retaining the Table I PCM material, the PCM portion of the via may be reduced in height to about 50 nm, and filling the remaining portion with conventional conductor material (e.g., tungsten), thus keeping the same "on" with a higher "off" resistance. These modified resistivity values lie within the range achievable by composition control.

TABLE IIIb

Estimated Power requirements for 0.1 μm PCM Vias

| Figure # | W (mW) | $R_h$ (KΩ) | I (mA) | V (V) |
|---|---|---|---|---|
| 5, 6 | 0.91 | 4.0 | 0.48 | 1.9 |
| 7 | 0.73 | 4.0 | 0.43 | 1.7 |
| 8 | 1.82 | 8.0 | 0.48 | 3.8 |
| 9 | 0.91 | 4.0 | 0.48 | 1.9 |

The heater voltage may, in some cases, require the option of using the available I/O line power supplies (e.g., 2-3 V). Current is also a significant consideration because it controls the width of the driving FET, which is typically larger than the via itself. Here, the smaller via dimensions (Table IIIb), combined with a higher resistivity heater material, is advantageous in this respect to the larger vias used in Table IIIa.

In considering scaling at constant programming power supply voltage and at fixed technology, the power needed to drive a via of diameter α scales as $\alpha^2$, where for the current I (C=constant):

$$I = C\alpha^2.$$

The drive output transistor width w is proportional to the current (B=constant):

$$w = BI,$$

hence $$w = BC\alpha^2.$$

The transistor width is typically the controlling dimension of the device, w>>α, hence the total device dimension scales as $\alpha^2$. There is thus a strong motivation, based on minimizing total programmable via device area, to make the via as small as possible, since device dimension goes as its square. Individual designs will also need to be optimized to the precise line voltage, so as to minimize current and hence device dimension.

1D Numerical Simulation of RESET and SET Processes

For an analysis of the programming of the PCM vias, certain additional factors that are taken into account (in addition to heat diffusion) include latent heat of melting of the PCM, as well as the kinetics of the propagating front corresponding to the melt interface. This is done through a numerical approach for heat and melt front propagation within the GST layer. First a one-dimensional model of a basic melt front is described because of its mathematical simplicity. In the following subsection, three-dimensional simulations of two designs (FIGS. 7 and 10) are described.

Including latent heat, conservation of energy modifies the diffusion equation for temperature T(z,t) in the GST (subscripts G refer to GST) to:

$$C_G \frac{dT}{dt} = K_G \frac{d^2 T}{dx^2} - L_G \frac{df_G}{dt},$$

where $f_G(z,t)$ is the fraction of melt in the material, and $L_G$ is the latent heat per unit volume.

The equation for the melt fraction dynamics is based on modified Wilson-Frenkel kinetics, with friction described by the Vogel-Fulcher form appropriate for "fragile glasses," and is given as:

$$\frac{df_G}{dt} = -V_m^0 \frac{\partial f_G}{\partial z},$$

where the melt front velocity V(T) is given by $$V(T) = V_0 e^{\frac{-E_a}{k_B(T-T_g)}} \left[ e^{\frac{\Delta S_m(T_m-T)}{k_B T}} - 1 \right],$$

in which $V_0$ is a characteristic velocity, $E_a$ is the activation energy for the transition from the amorphous to the crystalline phase, $\Delta S_m$ is the melt entropy, $T_m$ is the melt temperature, $T_g$ is a "glass" temperature, and temperatures are measured from absolute zero. Only propagation of the melt front $x_m$, not homogeneous nucleation, is taken into account, due to the relatively long nucleation time (μs even in thick films of some materials, though it may be faster in others) anticipated in nanometer-thickness films relative to the ns time scales of interest in RESET (a fast SET process is also assumed here, although time scales may be more extended in optimal engineering operation). In practice, numerical requirements dictate certain modifications to the basic procedure.

It will be noted that low temperature crystallization rates obey Arrhenius kinetics: A exp($-E^{low}_a/kT$), where $E^{low}_a$ is a low-temperature activation energy of order 2-3 eV. This analysis is an appropriate one for considering archival storage lifetime.

The boundary condition at the PCM surface for RESET is obtained from the approximate analysis of the previous subsection, the temperature profile being extended beyond the turn-off-time $t_0$ using the shift theorem, to give a profile qualitatively like that in FIG. 4:

$$T(0, t) = T_a + T_0 \sqrt{\frac{1}{t_0}} [t^{1/2} - \Theta(t-t_0)(t-t_0)^{1/2}].$$

In this equation, $t_0 = t_{quench}^{off}$ and $T_0 = T_{quench}^{max} - T_\alpha$ in the notation of Table IV, below.

The boundary condition at the PCM surface for SET is:

$$T(0, t) = T_a + T_0 \left[ \sqrt{\frac{1}{t_0}} t^{1/2} \Theta(t_0 - t) + \Theta(t - t_0) \right].$$

In this equation, $t_0 = t_{anneal}^{hold}$ and $T_0 = T_{anneal}^{hold} - T_\alpha$ in the notation of Table IV. The parameters in Table IV are partly based on an experimental study of laser-annealed spot crystallization kinetics in rotating PCM-coated disks. The maximum recrystallization front velocity is 2.2 m/s.

Figure 12:
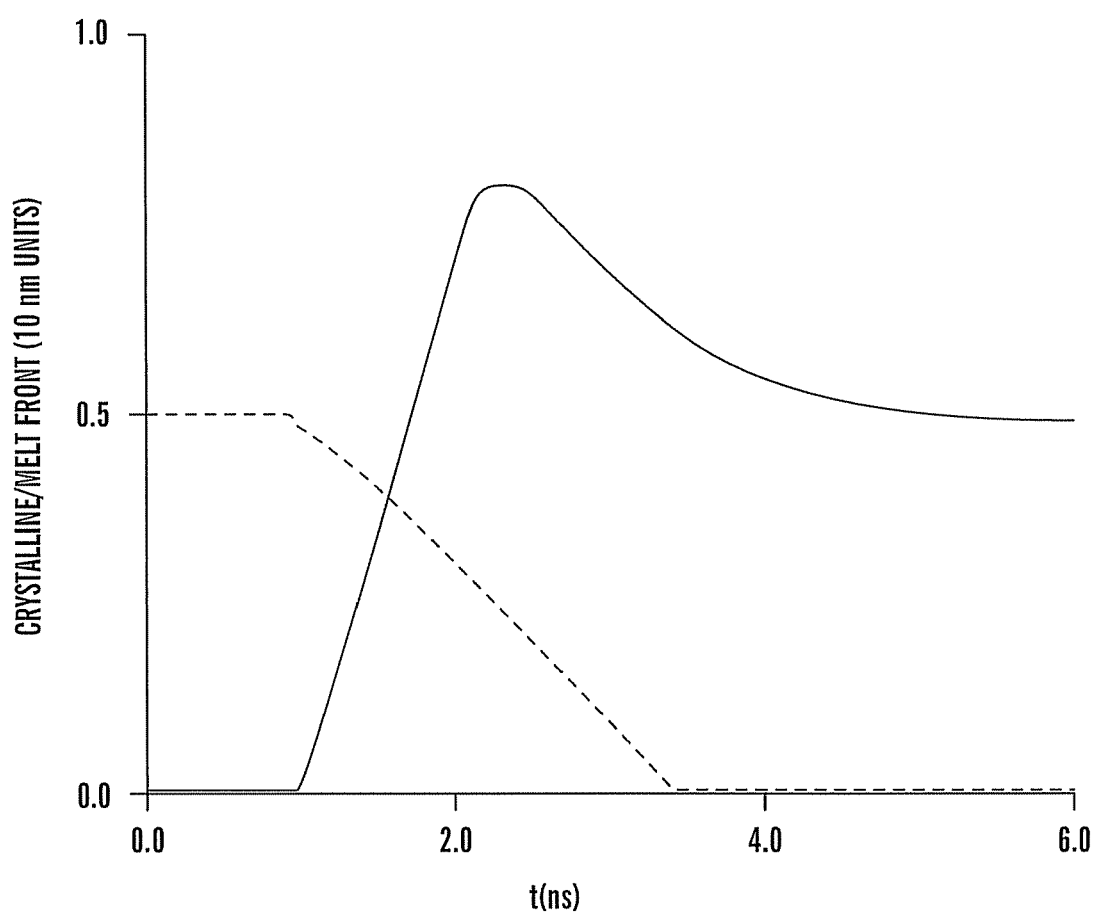
FIG. 12 is a plot of melt front location versus time in the quench and anneal steps of a PCM.

The results of the simulation with the foregoing parameters are shown in FIG. 12, which illustrates a plot of the melt front location vs. time in the quench and anneal steps. The anneal temperature is set at the maximum recrystallization velocity, thus the recrystallization time is relatively short.

TABLE IV

Main Parameters in 1D Simulation

| Symbol | value | Explanation |
| --- | --- | --- |
| $V_0$ | 900 ms$^{-1}$ | Velocity prefactor |
| $L_{PCM}$ | 50 nm | Thickness of PCM film |
| $T_m$ | 560° C. | Melt temp. |
| $T_{quench}^{max}$ | 868° C. | Max. transient quench temp. |
| $t_{quench}^{off}$ | 2.0 ns | Current turn-off time in quench |
| $T_{anneal}^{hold}$ | 480° C. | Hold temp. in anneal |
| $t_{anneal}^{hold}$ | 0.58 ns | Time for commence of hold in anneal |
| L | 120 Jcm$^{-3}$ | Latent heat of melting |
| $E_a$ | 15000 J/mole | Activation energy |
| $T_g$ | 85° C. | Glass temperature |
| $T_a$ | 27° C. | Ambient temperature |

Figure 13:
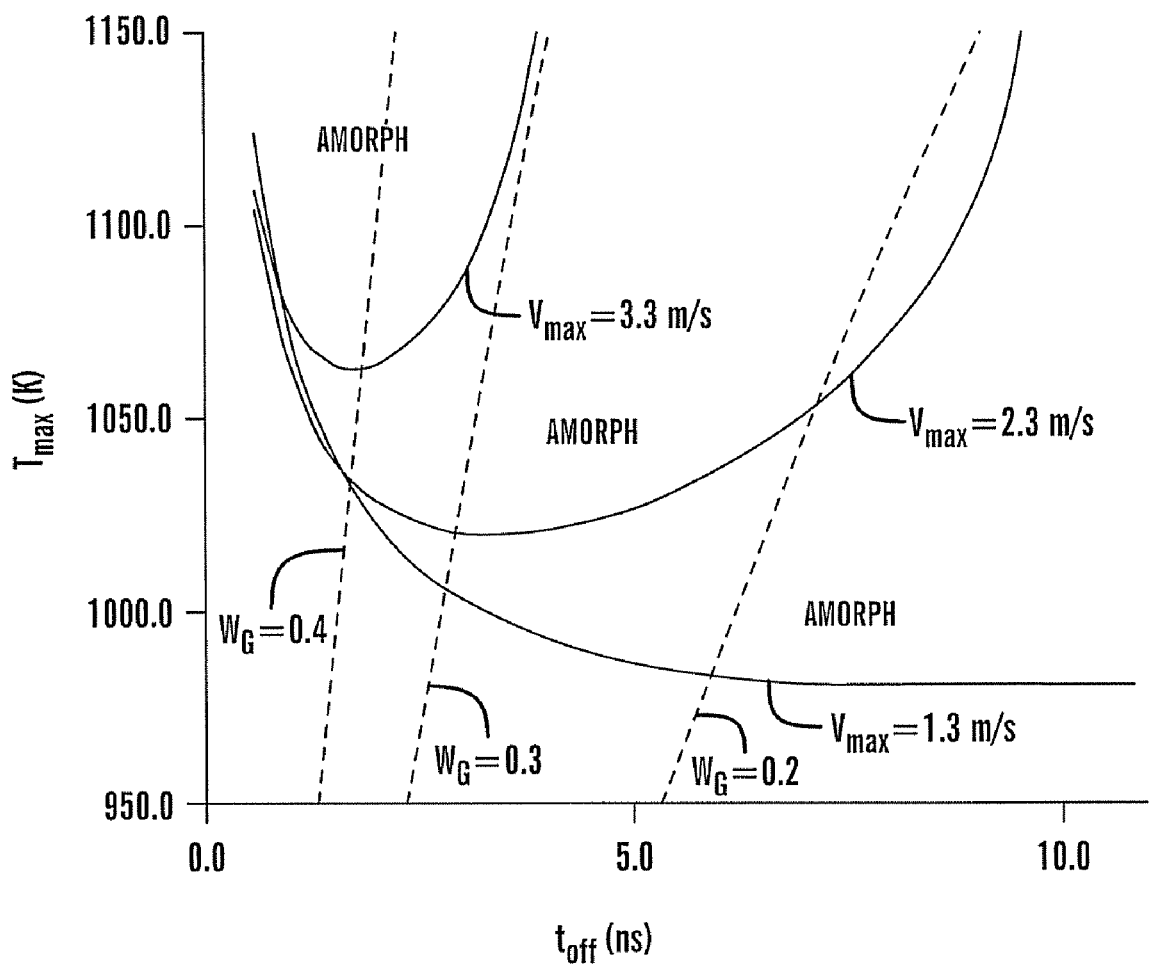
FIG. 13 is a graph illustrating amorphization envelopes for various crystallization velocities.

The latent heat is relatively low, and thus for approximation purposes, it may be neglected completely (though simulations have also been successfully implemented in which significant latent heat values have been included). FIG. 13 illustrates graphical results of a study (for zero latent heat) of the engineering envelope for the amorphization process. This is significant, since both heater power and turn-off time need to be adjusted to the PCM material characteristics. The Table IV parameters are used, except that three velocity prefactors, 500, 900, and 1300 ms$^{-1}$ were used (and parametrized by the maximum recrystallization front velocities), and the heater power and turn-off time were varied continuously. Amorphization is deemed possible where the long-time amorphous layer thickness exceeded 2.5 nm. Amorphization, with increasingly thick layers, occurs above the parabola-like curves in FIG. 13. Lines of constant heater power are defined by the dashed lines. As is illustrated, faster velocities require higher heater powers, raising the PCM to a higher temperature, along with shorter times. For a given velocity, there is typically a minimum power and a minimum temperature below which amorphization does not occur. A narrow range of turn-off times is appropriate for a given velocity and maximum temperature $T_{max}$.

3D Simulation of PCM Melt, Quench, and Anneal

Three-dimensional simulations of PCM encased in oxide with a metal heater were run to determine the geometry and time scale for the melt, quench, and anneal processes. In particular, a snapshot from a simulation with a solid slab of heating material in the separating plane between two PCM+oxide composites (embodiment of FIG. 7) was compared with a snapshot of the melting phase of another model with a ring of heating material and an oxide shell surrounding a continuous PCM volume (embodiment of FIG. 10). The results for the ring heater are similar to those for the slab heater, with slight differences in the shape of the melt front. These simulations also matched the results of the 1D simulations for the same 1D geometry. With the full 3D configuration of the heater and PCM material, the simulations confirm that the design performs as intended. The 3D simulations also provide a better power estimate for the operation of the via, as they involve no simplifyiing assumptions about the geometry, the boundary conditions, or 3D heat diffusion.

The physical constants introduced in the previous section were used, along with 3D versions of the equations, which are, in dimensionless form:

$$C_V \frac{\partial \phi}{\partial t} = \nabla \square (K \nabla \phi) - L \cdot \frac{\partial f_G}{\partial t} + H(\vec{x}, t)$$

$$\frac{\partial f_G}{\partial t} = -V \square \nabla f_G.$$

Here, $\phi = T/T_m$, $C_V$, K and L are the dimensionless specific heat, thermal conductivity, and latent heat of fusion, t and are dimensionless time and gradient, $f_G$ is the melt fraction, and V is the speed of the melt front:

$$V = V_0 e^{-2(\delta/r_0)^2} e^{-\frac{\tilde{E}_a}{\phi - \phi_g}} \left[ e^{-\tilde{g}_m(\frac{1}{\phi} - 1)} - 1 \right].$$

The temperature is controlled by the time- and position-dependent heat input, H. The rate of change of $f_G$ at any point depends on the distance $\delta$ between that point and the nearest melt front surface. The width of the melt front is taken to be $r_0$; $\phi_G = T_G/T_m$ is the normalized glass transition temperature. Dimensionless constants $V_0$, $\tilde{E}_a$, and $\tilde{g}_m$ were determined from the physical constants given in the previous sections.

The calculation is straightforward using finite differences for the derivatives with a rectilinear grid of cells; $\phi$ and $f_G$ are cell-centered quantities. The melt front is defined by the central points of all the cell walls that straddle cell volumes where $f_G < 0.5$ and $f_G > 0.5$. The nearest distance $\delta$ between a cell position and the melt front is determined by first finding the three nearest points on the melt front. These three points define a plane and the perpendicular distance between the cell position and the plane is determined by vector trigonometry.

FIG. 14 illustrates a snapshot from a simulation with a solid slab of heating material in the separating plane between two PCM+oxide composites (embodiment of FIG. 7). The figure uses a 3D volume rendered projection with grayscale proportional to temperature (dark is hot). The grid points that define the melt front are shown as tiny dots. The time step is 60 ns after the heater is turned on, when the melt front is still moving up and down on either side of the heater slab.

FIG. 15 illustrates a snapshot at 60 ns into the melting phase of another model with a ring of heating material and an oxide shell surrounding a continuous PCM volume (embodiment of FIG. 10). The results for the ring heater are similar to those for the slab heater, with slight differences in the shape of the melt front.

For both the slab and ring heater models, the PCM is on the inside of an oxide shell. The PCM outer dimensions are 100×100×131.25 nm$^3$, while the outer dimensions of the oxide shell are 200×200×231.25 nm$^3$. Smaller samples were also simulated; they show the same behavior but have shorter timescales for all the phase changes.

The temperature structure inside the model is much smoother than the melt structure, which has sharp fronts separating the different phases. To resolve $f_G$ without doing unnecessary calculations for $\phi$, the simulation uses a fine grid for $f_G$ and a coarse grid for $\phi$. For temperature, the simulations in the ring case use a grid measuring 32×32×37 cells with PCM in the central 16×16×21 cells. The heater measures 32×32×3 cells with the central 16×16×3 cut out and filled with PCM connected to the rest of the PCM. In the slab case, the heater bifurcates the PCM by occupying the horizontal midplane in 32×32×3 cells. In all cases, the PCM has a grid for melt fraction, $f_G$, which is 4 times finer than the temperature grid.

The heating function H is taken to be a constant for three intervals of time. During the melting phase, H is large enough to make the peak temperature in the heating zone increase to about $\phi=1.5$. In the quench phase, H=0, so the material returns to room temperature. In the anneal phase, H comes back on for 200 ns but with a value slightly smaller than in the melt phase, now making the peak $\phi$ equilibrate to around 0.98.

The simulations indicate that the PCM in our configurations develop melted holes in the center during the SET phase, thereby changing the electrical conductivity from top to bottom as required by the device. The PCM is quenched when the heating rate is dropped suddenly, and it anneals when the temperature is raised to just below the melting temperature.

The power required to melt the PCM in the ring simulation was 2.8 mW for a heater measuring 0.2×0.2×0.01875 cubic microns; the power for the slab simulation was slightly less, 1.9 mW, for the same dimensions. The slab required less power than the ring because the slab has a greater area in contact with the PCM.

Finally, the considerations for selection of an appropriate PCM are summarized below. As was alluded to previously, suitable PCM materials include not only Ge, Sb, and Te, but also other elements such as Ag, In, Sn, for example, as well as dopants such as N. Generally speaking, desirable PCM properties include archival stability at about 85°-95° C., which tends to improve with Ge content. In addition, crystallization front speed may be on the order of about $V_0 < 45$ m/s (with maximum recrystallization velocity on the order of about <1.1 m/s acceptable), which correlates with low Sb content. The nucleation rate of the PCM should be low enough to avoid nucleation during quench (i.e., at high temperature), although the specific mechanism of recrystallization is of no particular concern for application (in contrast to a compact disk read/write (CDRW) application).

As indicated above, the "on"/"off" ratio is preferably high, while the "on" resistance (depending upon the particular structural embodiment) preferably utilizes a high conductance material such as $GeSb_4$ (e.g., FIG. 9). For other designs, however, the "off" resistance requirements dictates the use of a lower conductance material.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for programming a programmable link structure of a three dimensional integration (3DI) semiconductor devices, comprising:
    passing a current through a heating device, said heating device proximate a via filled at least in part with a phase change material (PCM), said via thereby defining a programmable link between an input connection located at one end thereof and an output connection located at another end thereof;
    wherein said input connection of said programmable link is formed on a first metal level, input and output terminals for said heating device are located on a second metal level, and said output connection of said programmable link is formed on a third metal level;
    wherein said via filled at least in part with said PCM is disposed between said input connection of said programmable link and a top side of said heating device, and wherein another via is disposed between a bottom surface of said heating device and said output connection of said programmable link, with said another via being disposed directly beneath one of the input and output terminals for said heating device, said another via filled with a metal material; and
    wherein said heating device is configured to switch the conductivity of a transformable portion of said PCM between a lower resistance crystalline state and a higher resistance amorphous state.

2. The method of claim 1, further comprising implementing a reset operation to electrically open said programmable link by selecting said current through said heating device so as to transform said transformable portion of said PCM material from said crystalline state to said amorphous state by raising the temperature of said PCM above the melting point thereof, followed by a quench to retain the arrangement of atoms in said PCM in said amorphous state.

3. The method of claim 2, further comprising implementing a set operation to electrically close said programmable link by selecting said current through said heating device so as to transform said transformable portion of said PCM material from said amorphous state to said crystalline state by annealing said PCM at a temperature lower than said melting point so as to cause said atoms to crystallize.

* * * * *